United States Patent
Zhu et al.

(10) Patent No.: US 10,218,171 B2
(45) Date of Patent: Feb. 26, 2019

(54) SURGE PROTECTION CIRCUIT

(71) Applicant: NXP B.V., Eindhoven (NL)

(72) Inventors: Dongyong Zhu, Shanghai (CN); Arjan Mels, Nijmegem (NL); Peter Christiaans, San Jose, CA (US)

(73) Assignee: NXP B.V., San Jose, CA (US)

( * ) Notice: Subject to any disclaimer, the term of this patent is extended or adjusted under 35 U.S.C. 154(b) by 257 days.

(21) Appl. No.: 15/344,552

(22) Filed: Nov. 6, 2016

(65) Prior Publication Data

US 2017/0373490 A1 Dec. 28, 2017

(30) Foreign Application Priority Data

Jun. 24, 2016 (CN) .......................... 2016 1 0473491

(51) Int. Cl.
*H02H 9/02* (2006.01)
*H02H 9/04* (2006.01)
*H01L 27/02* (2006.01)

(52) U.S. Cl.
CPC ......... *H02H 9/025* (2013.01); *H01L 27/0255* (2013.01); *H01L 27/0266* (2013.01); *H01L 27/0285* (2013.01); *H01L 27/0288* (2013.01); *H02H 9/046* (2013.01)

(58) Field of Classification Search
CPC ............. H01L 27/0255; H01L 27/0266; H01L 27/0285; H01L 27/0288; H02H 9/025; H02H 9/026
USPC .......................................................... 361/56
See application file for complete search history.

(56) References Cited

U.S. PATENT DOCUMENTS

| | | | |
|---|---|---|---|
| 5,311,391 A | | 5/1994 | Dungan et al. |
| 5,946,177 A | * | 8/1999 | Miller ................. H01L 27/0248 361/56 |
| 2010/0254051 A1 | * | 10/2010 | Jeon ....................... H02H 9/046 361/56 |
| 2012/0161216 A1 | | 6/2012 | Liang et al. |
| 2013/0100561 A1 | | 4/2013 | Senouci et al. |

(Continued)

FOREIGN PATENT DOCUMENTS

| | | |
|---|---|---|
| CN | 104242285 | 12/2014 |
| CN | 104332981 | 2/2015 |
| EP | 2355152 | 8/2011 |

OTHER PUBLICATIONS

Wiliiam D. Mack and Robert G. Meyer, "New ESD Protection Schemes for BiCMOS Processes with Application to Cellular Radio Designs", ISCAS Proceedings, IEEE International Symposium, vol. 6, 1992. pp. 2699-2702.

(Continued)

*Primary Examiner* — Kevin J Comber
(74) *Attorney, Agent, or Firm* — Charles E. Bergere (57) ABSTRACT

A surge protection circuit includes a DC trigger circuit that generates a trigger signal when a surge pulse occurs, and a current conducting unit, coupled to the DC trigger circuit, that generates a first clamp voltage as an output voltage of the surge protection circuit and conducts surge currents to ground in response to the trigger signal. The DC trigger circuit includes a surge detection circuit and a first amplification circuit. The surge detection circuit detects if a surge pulse occurs, and triggers the first amplification circuit to generate the trigger signal when the surge detection circuit detects a surge pulse.

6 Claims, 6 Drawing Sheets

(56) References Cited

U.S. PATENT DOCUMENTS

2013/0128400 A1  5/2013  Yeh
2016/0071836 A1  3/2016  Tsai

OTHER PUBLICATIONS

Vladislav Vashchenko, Bierina Aliaj, Augusto Tazzoil, and Andrei Shibkov, "Active Clamps with Hybrid BJT-CMOS Operation Modes", Electrical Overstress/Electrostatic Discharge (EOS/ESD) Symposium, 2015. pp. 1-7.

* cited by examiner

SURGE PROTECTION CIRCUIT

BACKGROUND

The present invention is directed to a protection circuit and, more particularly, to an on-chip surge protection circuit.

With high demand for the consumer electronic product, especially mobile products, many mobile products such as cell phones or tablets have a high return rate due to damage caused by current surges. One conventional surge protection method is to provide off-chip surge protection for integrated circuits (ICs) by adding off-chip Transient Voltage Suppression (TVS) diodes. However, such TVS diodes require additional space and increase circuit board cost. Thus, it is desired to have an on-chip surge protection circuit. Some on-chip Electro-Static Discharge (ESD) protection methods have been proposed.

Figure 1:
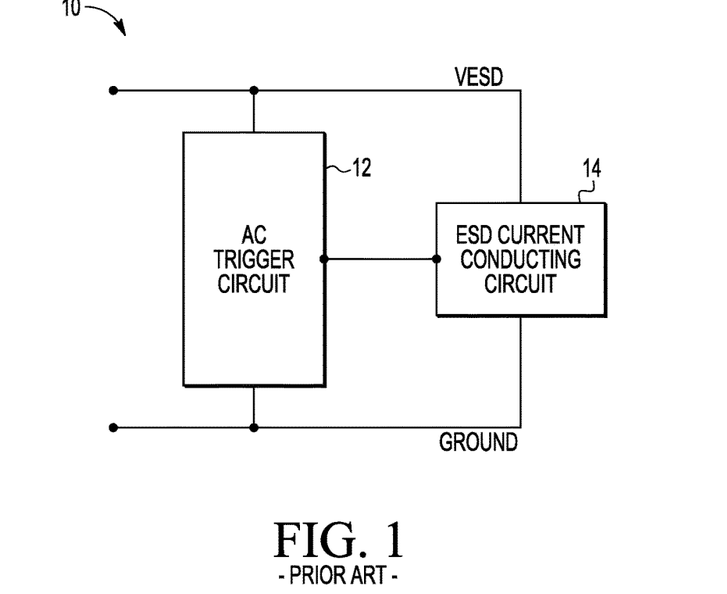
FIG. 1 is a schematic block diagram of a conventional rail clamp based on-chip ESD protection circuit.

FIG. 1 is a schematic block diagram of a conventional rail clamp based, on-chip ESD protection circuit 10. The ESD protection circuit 10 has an ESD immunity capability that meets the requirements defined by JEDEC standards and IEC61000-4-2. The ESD protection circuit 10 includes an AC trigger circuit 12 and an ESD current conducting circuit 14.

Figure 2:
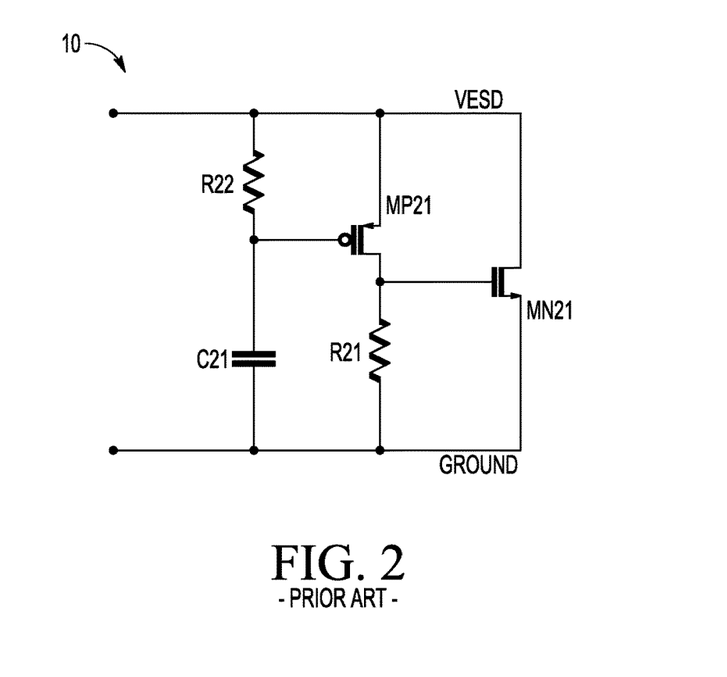
FIG. 2 is a schematic circuit diagram of the ESD protection circuit shown in FIG. 1.

FIG. 2 is a schematic circuit diagram of the ESD protection circuit 10 shown in FIG. 1. In the ESD protection circuit shown in FIG. 2, the AC trigger circuit 12 includes a resistor R21, a capacitor C21, a P-type transistor MP21 and a resistor R22, and the ESD current conducting circuit 14 includes a large N-type transistor MN21.

When ESD pulses occur, the AC trigger circuit 12 responds fast enough for these ESD pulses, then triggers the ESD current conducting circuit MN21 to turn on and conduct the ESD currents to ground.

The AC trigger circuit 12 is powered by the ESD pulses, and the ESD currents charge the capacitor C21 to generate Vgs for the P-type transistor MP21. The P-type transistor MP21 and the resistor R21 then turn on the N-type transistor MN21. The N-type transistor MN21 operates in a normal MOSFET mode, not in a bipolar mode, during the ESD events. The N-type transistor MN21 turns on and remains active to conduct the ESD currents to ground.

However, the ESD current conducting circuit 14 can only be active for several hundreds of nanoseconds or less, which is much less than the period of surge events, which are around 50 μs or longer pulse duration. Therefore the conventional ESD protection circuit 10 cannot handle surge events. Thus, some solutions have been proposed to use the off-chip TVS diodes to solve this problem, but using off-chip TVS diodes still does not address the problems of increased board space and cost.

Figure 3:
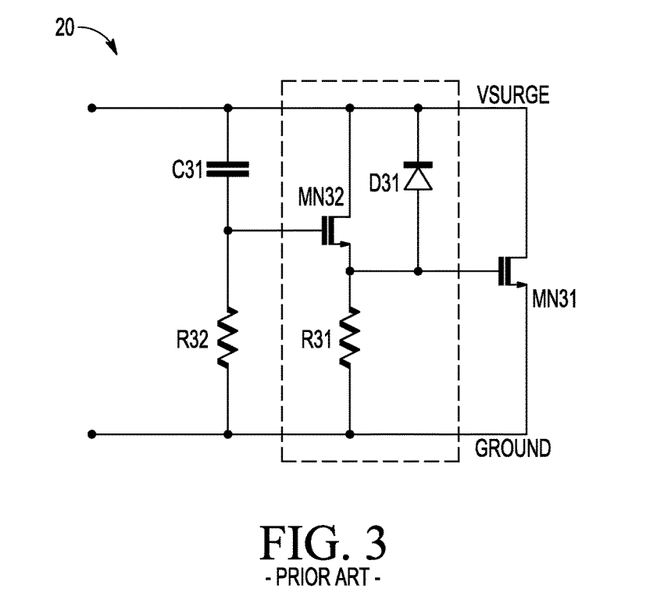
FIG. 3 is a schematic circuit diagram of a conventional on-chip surge protection circuit.

FIG. 3 is a schematic circuit diagram of another conventional on-chip surge protection circuit 20. The surge protection circuit 20 includes a DC trigger circuit and an AC trigger circuit. The DC trigger circuit includes a diode D31 and a resistor R31, and the AC trigger circuit includes a capacitor C31, a resistor R32, a N-type transistor MN32, and the resistor R31. The N-type transistor MN31 is used as an ESD current conducting circuit. The diode D31 is configured between a surge clamp voltage output terminal Vsurge and a gate of the N-type transistor MN31.

During surge events, the diode D31 enters a reverse turn-on state when a surge input voltage exceeds a predetermined voltage, and then currents flow through the resistor R31, thereby generating a bias voltage at the gate of the N-type transistor MN31. When the bias voltage at the gate of the N-type transistor MN31 becomes large enough, the N-type transistor MN31 turns on and clamps the surge input voltage at a relatively low voltage and surge currents are conducted to ground.

Although the circuit shown in FIG. 3 is realized an on-chip surge protection circuit, it has the following problems:

(1) Variation of the clamp output voltage generated by the surge protection circuit is very large along with different levels of surge pulses. Since different levels of surge pulses cause a large voltage variation on the resistor R31, and the voltage variation on the resistor R31 causes a large voltage variation at the gate of the N-type transistor MN31, there is a large variation of the clamp output voltage.

(2) The voltage headroom required by this surge protection circuit is large because the voltage required to turn on the N-type transistor MN31 is added to the clamp output voltage, which causes the clamp output voltage to be possibly above a breakdown voltage of the N-type transistor MN31 or a circuit being protected.

It is desired to have an on-chip surge protection circuit that is capable of solving the above issues, especially to have an on-chip surge protection circuit which has several tens of volt voltages to one hundred volt voltage surge immunity level in mobile applications.

SUMMARY

The present invention provides a surge protection circuit. The surge protection circuit comprises a DC trigger circuit that generates a trigger signal when a surge pulse occurs, and a current conducting unit, coupled to the DC trigger circuit, that generates a first clamp voltage as an output voltage of the surge protection circuit and conducts surge currents to ground in response to the trigger signal. The DC trigger circuit includes a surge detection circuit and a first amplification circuit. The surge detection circuit detects if a surge pulse occurs, and triggers the first amplification circuit to generate the trigger signal when the surge detection circuit detects a surge pulse.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION

Figure 4A:
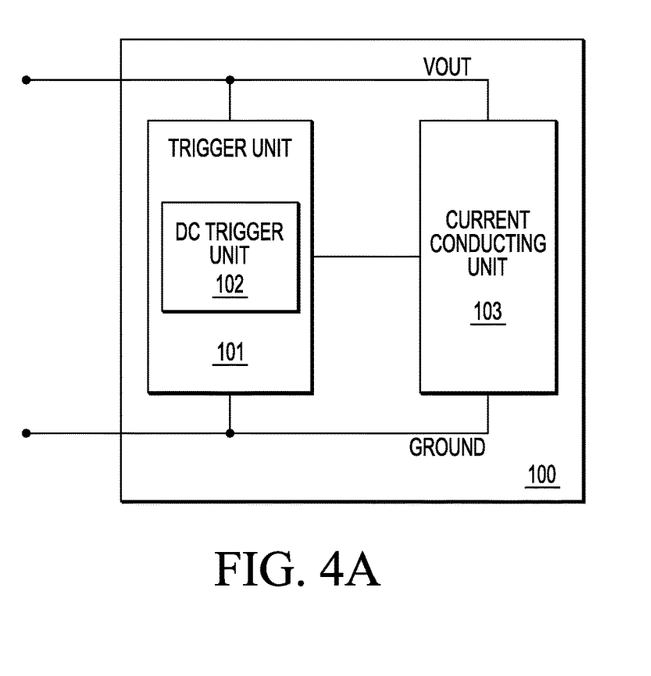
FIG. 4A is a schematic block diagram of a surge protection circuit in accordance with an exemplary embodiment of the present invention.

FIG. 4A is a schematic block diagram of a surge protection circuit 100 in accordance with an exemplary embodiment of the present invention. As shown in FIG. 4A, the surge protection circuit 100 comprises a trigger unit 101 and a current conducting unit 103 coupled to the trigger unit 101. The trigger unit 101 includes a DC trigger circuit 102 that generates a trigger signal when a surge pulse occurs. The current conducting unit 103 generates a first clamp voltage Vclamp_1 as an output voltage Vout of the surge protection circuit and conducts surge currents to ground in response to the trigger signal.

Figure 4B:
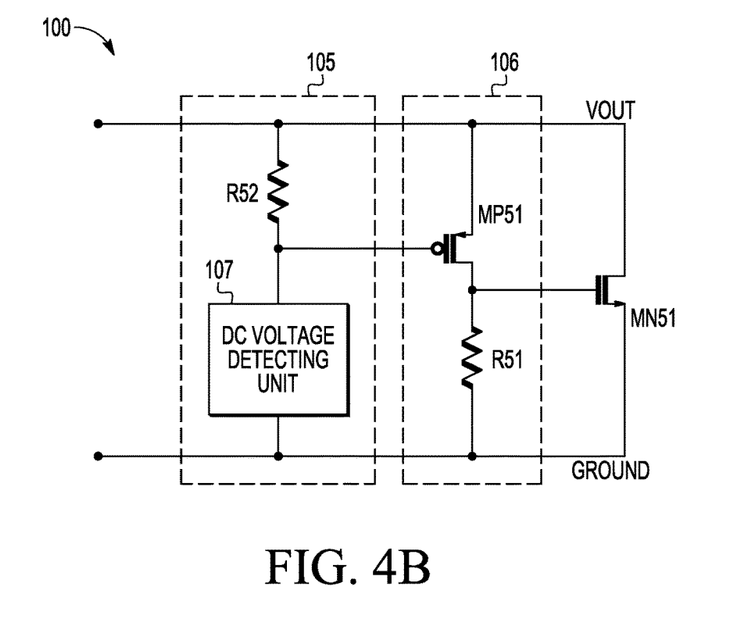
FIG. 4B is a schematic circuit diagram of the surge protection circuit shown in FIG. 4A.

FIG. 4B is a schematic circuit diagram of the surge protection circuit 100. In FIG. 4B, the DC trigger circuit 102 includes a surge detection circuit 105 and an amplification circuit 106. The surge detection circuit 105 detects if a surge pulse occurs, and triggers the amplification circuit 106 to generate the trigger signal when the surge detection circuit 105 detects a surge pulse.

As an exemplary embodiment, the amplification circuit 106 includes a P-type transistor MP51 and a first impedance unit. In the exemplary embodiment, the first impedance unit is a resistor R51. Although it should apparent to one of skill in the art that other kinds of impedance elements may be used as the first impedance unit of the amplification circuit 106.

A first terminal (gate terminal) of the P-type transistor MP51 is coupled to the surge detection circuit 105, a second terminal (source terminal) of the P-type transistor MP51 is coupled to an input terminal of the surge protection circuit 100, and a third terminal (drain terminal) of the P-type transistor MP51 is coupled to both the resistor R51 and the current conducting unit 103.

A N-type transistor MN51 is used as the current conducting unit 103 in the exemplary embodiment. A first terminal (gate terminal) of the N-type transistor MN51 is coupled to the third terminal (drain terminal) of the P-type transistor MP51, a second terminal (drain terminal) of the N-type transistor MN51 is coupled to the input terminal of the surge protection circuit 100, and a third terminal (source terminal) of the N-type transistor MN51 is coupled to ground.

The surge detection circuit 105 includes a second impedance unit and a DC voltage detection circuit 107. In the exemplary embodiment shown by FIG. 4B, the second impedance unit comprises a resistor R52. However, it should be understood by those of skill in the art that other kinds of impedance elements may be used as the second impedance unit of the surge detection circuit 105.

A first terminal of the second impedance unit R52 is coupled to the input terminal of the surge protection circuit 100, and a second terminal of the second impedance unit R52 is coupled to both the DC voltage detection circuit 107 and the first terminal (gate terminal) of the P-type transistor MP51.

The DC voltage detection circuit 107 turns on and triggers the P-type transistor MP51 to turn on to generate the trigger signal when a surge pulse occurs. Specifically, the DC voltage detection circuit 107 detects a DC voltage for a surge event, and generates a Vgs continuously for the P-type transistor MP51 to trigger the P-type transistor MP51 to turn on. The DC voltage detection circuit 107 can be active for a time period long enough for surge pulses. The P-type transistor MP51 and the resistor R51 trigger the N-type transistor MN51 to turn on so that the N-type transistor MN51 generates a first clamp voltage Vclamp_1 as an output voltage Vout of the surge protection circuit 100 and conducts surge currents to ground. The N-type transistor MN51 is kept in a turn-on state until the surge event is over.

Figure 5A:
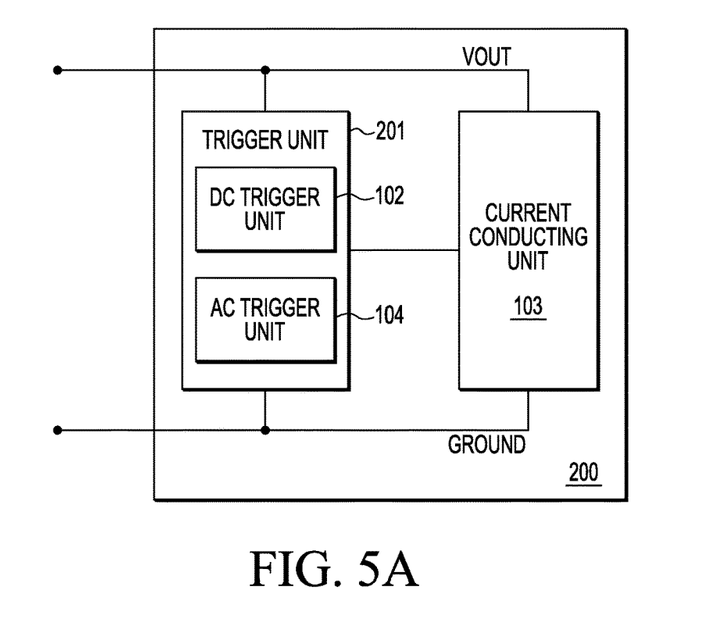
FIG. 5A is a schematic block diagram of a surge protection circuit in accordance with another exemplary embodiment of the present invention.

FIG. 5A is a schematic block diagram of a surge protection circuit 200 in accordance with another exemplary embodiment of the present invention. Like the surge protection circuit 100 shown in FIG. 4A, the surge protection circuit 200 comprises the DC trigger circuit 102 and the current conducting unit 103. In the exemplary embodiment, the surge protection circuit 200 further comprises an AC trigger circuit 104.

Figure 5B:
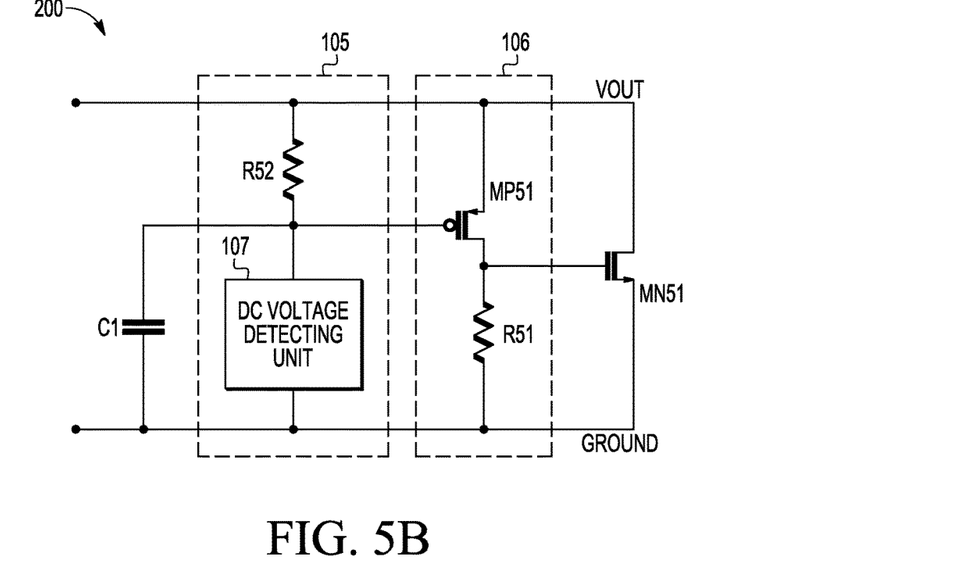
FIG. 5B is a schematic circuit diagram of the surge protection circuit shown in FIG. 5A.

FIG. 5B is a schematic circuit diagram of the surge protection circuit 200. Like the surge protection circuit 100 shown in FIG. 4B, the DC trigger circuit 102 includes the surge detection circuit 105 and the amplification circuit 106.

The AC trigger circuit 104 includes a capacitor C51, the resistor R52, and the amplification circuit 106. The capacitor C51 is coupled between the first terminal (gate terminal) of the P-type transistor MP51 and ground. The amplification circuit 106 includes the P-type transistor MP51 and the resistor R51. In the AC trigger circuit 104, the amplification circuit 106 is used to trigger the current conducting unit 103 to conduct ESD currents to ground and generate a second clamp voltage Vclamp_2 as an output voltage Vout of the surge protection circuit 200 when an ESD pulse occurs.

Since the surge protection circuit 200 includes both the DC trigger circuit 102 and the AC trigger circuit 104, the surge protection circuit 200 can provide both surge and ESD immunity protection.

The DC voltage detection circuit 107 can be implemented by a variety of elements as long as the elements can show a sudden increase in current at a certain voltage level. As an exemplary embodiment, the DC voltage detection circuit 107 may include one or more elements selected from a diode group and a transistor group. The diode group may include forward diodes, junction diodes, Zener diodes, etc. The transistor group may include NMOS transistors, PMOS transistors, bipolar transistors, extended drain transistors and etc.

Figure 6A:
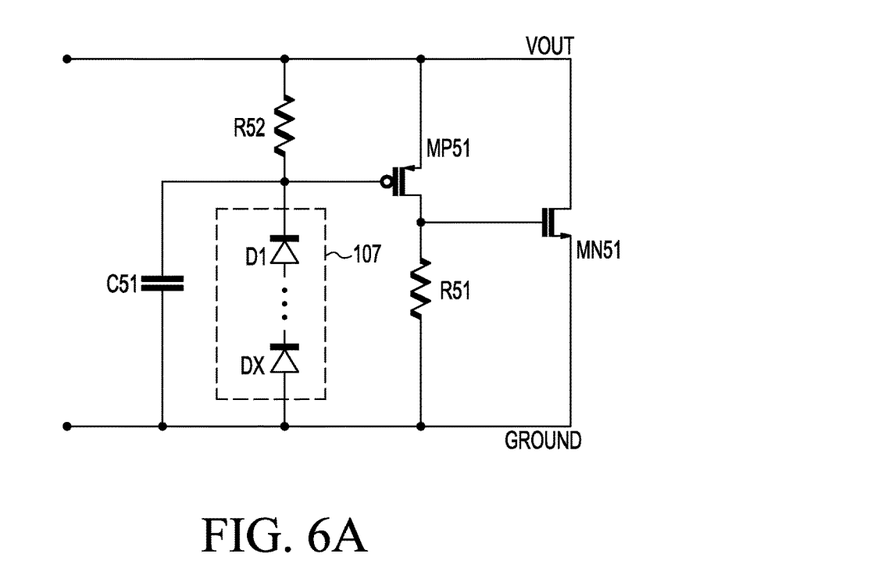
FIG. 6A illustrates an internal circuit of a DC voltage detection circuit in the schematic circuit diagram of the surge protection circuit of FIG. 5B.

FIG. 6A shows an example of the DC voltage detection circuit 107, which includes a plurality of cascaded diodes D1~Dx. The cascaded diodes D1~Dx detect a DC voltage for a surge event and enter a reverse turn-on state when the DC voltage exceeds a predetermined voltage. After these cascaded diodes D1~Dx turn on, they generate a Vgs continuously for the P-type transistor MP51 to trigger the P-type transistor MP51 to turn on.

Figure 6B:
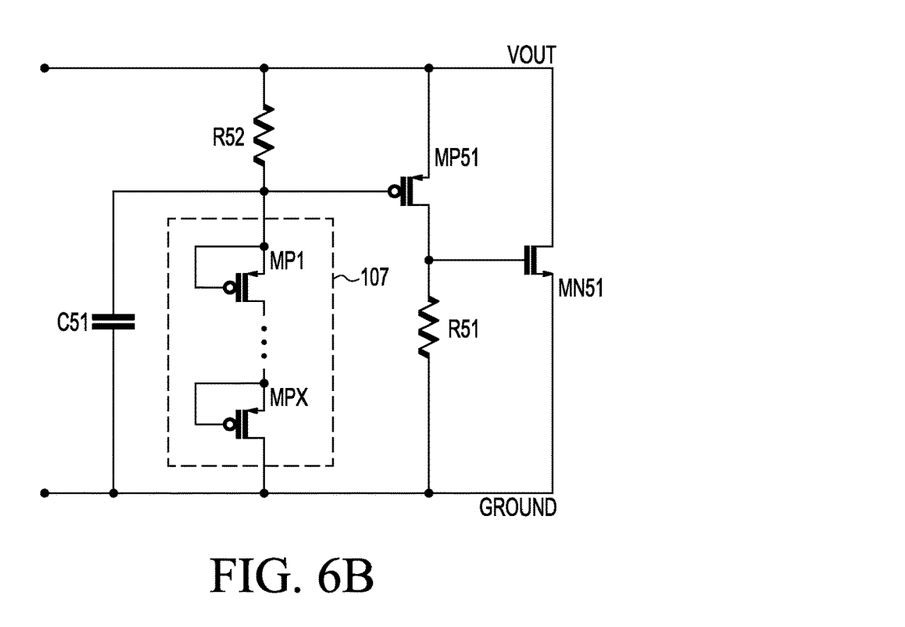
FIG. 6B illustrates another internal circuit of a DC voltage detection circuit in the schematic circuit diagram of the surge protection circuit of FIG. 5B.

FIG. 6B shows another example of the DC voltage detection circuit 107, which includes a plurality of cascaded PMOS transistors MP1~MPx. The PMOS transistors MP1~MPx may be SGPMOS transistors. The cascaded PMOS transistors MP1~MPx detect a DC voltage for a surge event and can be triggered to turn on when the DC voltage exceeds a predetermined voltage. After the cascaded PMOS transistors MP1~MPx turn on, they generate a Vgs continuously for the P-type transistor MP51 to trigger the P-type transistor MP51 to turn on.

Figure 7A:
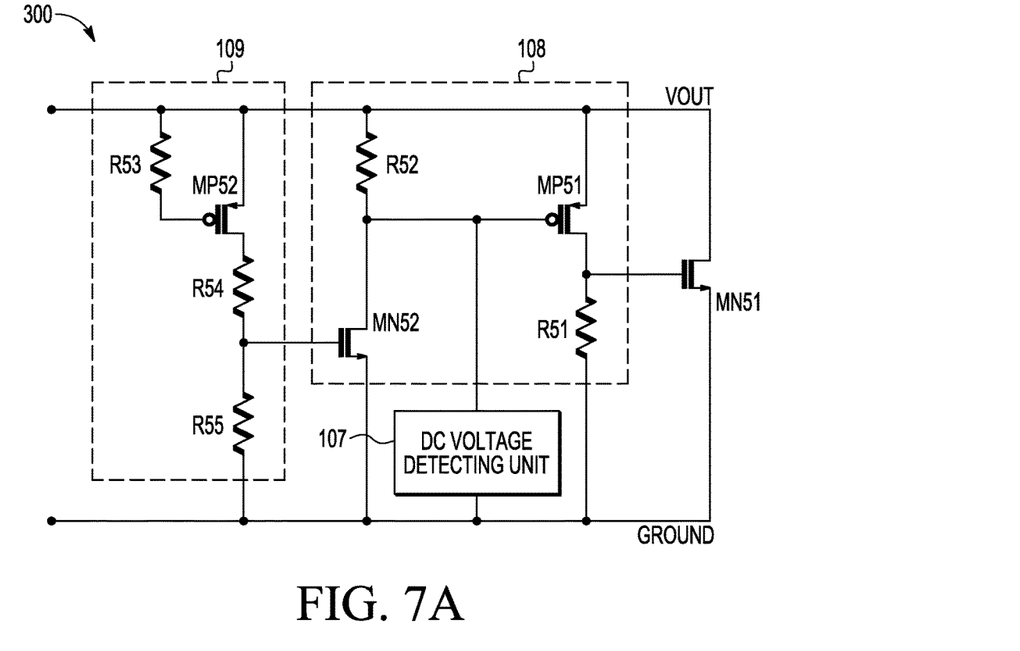
FIG. 7A is a schematic circuit diagram of a surge protection circuit in accordance with another exemplary embodiment of the present invention.

FIG. 7A is a schematic circuit diagram of a surge protection circuit 300 in accordance with another exemplary embodiment of the present invention. The surge protection circuit 300 comprises a DC trigger circuit, an AC trigger circuit and a current conducting unit. Like the DC trigger circuit shown in FIG. 4B and FIG. 5B, the DC trigger circuit of the surge protection circuit 300 includes the surge detection circuit 105 and the amplification circuit 106. The amplification circuit 106 includes the P-type transistor MP51 and the first impedance unit. The surge detection circuit 105 includes the second impedance unit and the DC voltage detection circuit 107. The resistor R51 is used as the first impedance unit, and the resistor R52 is used as the second impedance unit.

The AC trigger circuit of the surge protection circuit 300 includes an amplification circuit 108 and a voltage lifting circuit 109 that lifts an input voltage of the amplification circuit 108. The amplification circuit 108 has two amplification stages for triggering the current conducting unit 103 to conduct ESD currents to ground and generate a second clamp voltage Vclamp_2 as the output voltage Vout of the surge protection circuit 300 when an ESD pulse occurs.

In the exemplary embodiment shown in FIG. 7A, the amplification circuit 108 includes a N-type transistor MN52 and the second impedance unit as a first amplification stage, and the P-type transistor MP51 and the first impedance unit as a second amplification stage.

The voltage lifting circuit 109 is coupled to an input terminal of the surge protection circuit 300 and the amplification circuit 108. Specifically, as shown in FIG. 7A, the voltage lifting circuit 109 is coupled to the input terminal of the surge protection circuit 300 and a first terminal (gate terminal) of the N-type transistor MN52. A second terminal (drain terminal) of the N-type transistor MN52 is coupled to the first terminal (gate terminal) of the P-type transistor MP51.

The voltage lifting circuit 109 includes a resistor R53, a P-type transistor MP52, a resistor R54 and a resistor R55. One terminal of the resistor R53 is coupled to the input terminal of the surge protection circuit 300, and the other terminal of the resistor R53 is coupled to a first terminal (gate terminal) of the P-type transistor MP52. A second terminal (source terminal) of the P-type transistor MP52 is coupled to the input terminal of the surge protection circuit 300, and a third terminal (drain terminal) of the P-type transistor MP52 is coupled to one terminal of the resistor R54. The other terminal of the resistor R54 is coupled to both one terminal of the resistor R55 and the first terminal (gate terminal) of the N-type transistor MN52. The other terminal of the resistor R55 is coupled to ground.

The voltage lifting circuit 109 lifts a voltage at the first terminal (gate terminal) of the N-type transistor MN52 when an ESD pulse occurs. Specifically, the resistor R53, the P-type transistor MP52, the resistor R54 and the resistor R55 create a RC time to lift the voltage at the gate terminal of the N-type transistor MN52 fast enough during an ESD event.

Since the AC trigger circuit of the surge protection circuit 300 includes two amplification stages, it can further enhance the amplification capability of the trigger signal, which causes the N-type transistor MN51 to turn on.

The AC trigger circuit is not limited to have only two amplification stages, and it may include multiple amplification stages for triggering the current conducting unit 103.

Figure 7B:
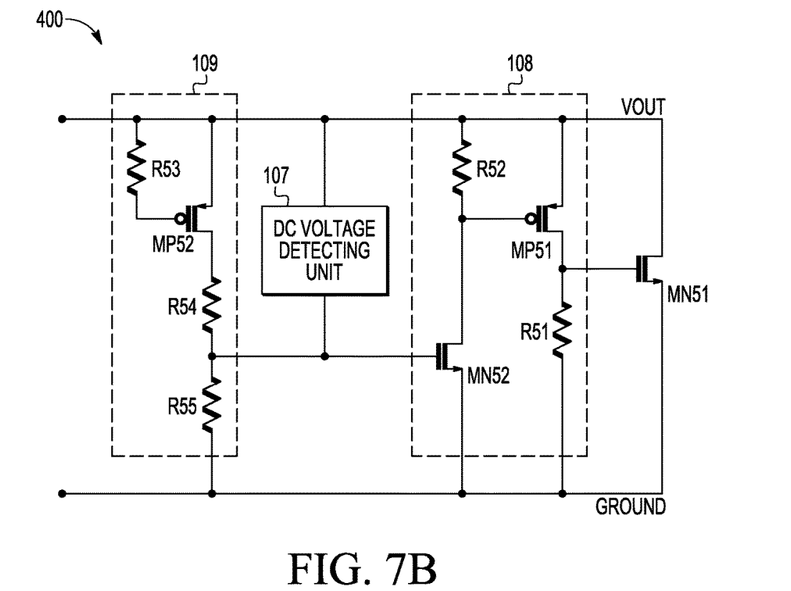
FIG. 7B is a schematic circuit diagram of a surge protection circuit in accordance with a further exemplary embodiment of the present invention.

FIG. 7B is a schematic circuit diagram of a surge protection circuit 400 in accordance with a further exemplary embodiment of the present invention. The surge protection circuit 400 comprises a DC trigger circuit, an AC trigger circuit and a current conducting unit.

In this embodiment, the current conducting unit comprises the N-type transistor MN51.

The DC trigger circuit includes the surge protection circuit 105 (see FIG. 5B) and the amplification circuit 106 (see FIG. 5B), where the surge detection circuit 105 includes a third impedance unit R55 and a DC voltage detection circuit 107, and the amplification circuit 108 includes N-type transistor MN52 and the second impedance unit R52 as the first amplification stage, and the P-type transistor MP51 and the first impedance unit R51 as the second amplification stage. In FIG. 7B, an amplification stage 108 is shown (like the amplification stage 108 of FIG. 7A, which includes MP51, MN52, R51 and R52.

A first terminal of the DC voltage detection circuit 107 is coupled to the input terminal of the surge protection circuit 400, and a second terminal of the DC voltage detection circuit 107 is coupled to both the third impedance unit (the resistor R55) and the first terminal (gate terminal) of the N-type transistor MN52. The DC voltage detection circuit 107 turns on and triggers the N-type transistor MN52 to turn on when a surge pulse occurs.

The AC trigger circuit of the surge protection circuit 400 includes the amplification circuit 108 and the voltage lifting circuit 109 that lifts an input voltage of the amplification circuit 108.

The amplification circuit 108 triggers the current conducting unit MN51 to conduct ESD currents to ground and generate a second clamp voltage Vclamp_2 as an output voltage Vout of the surge protection circuit 400 when an ESD pulse occurs.

A first terminal of the voltage lifting circuit 109 is coupled to an input terminal of the surge protection circuit 400, a second terminal of the voltage lifting circuit 109 is coupled to both the DC voltage detection circuit 107 and a first terminal (gate terminal) of the N-type transistor MN52.

Like the voltage lifting circuit 109 of the surge protection circuit 300, the voltage lifting circuit 109 also includes a resistor R53, a P-type transistor MP52, a resistor R54 and a resistor R55. Both the resistor R54 and the resistor R55 are coupled to the DC voltage detection circuit 107 and the first terminal (gate terminal) of the N-type transistor MN52.

In the above exemplary embodiments, both the DC trigger circuit and the AC trigger circuit may use the same amplification circuit as shown in FIG. 5B and FIG. 7B, while the DC trigger circuit and the AC trigger circuit may use different amplification circuits as shown in FIG. 7A.

The N-type transistor MN51 may be a N-type MOS device or a NPN device. It is also possible to use a P-type transistor (such as MOS device or PNP device) as the current conducting unit 103. However an implementation with a P-type MOS device as the current conducting unit MN51 is usually less desirable due to the lower mobility/higher resistance of the P-type MOS device.

Figure 8A:
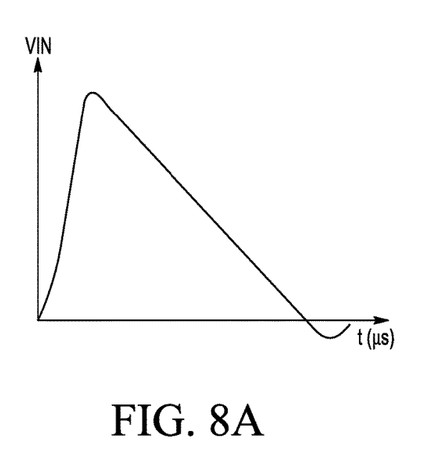
FIG. 8A is a graph of a surge input voltage of the surge protection circuit of the present invention.
Figure 8B:
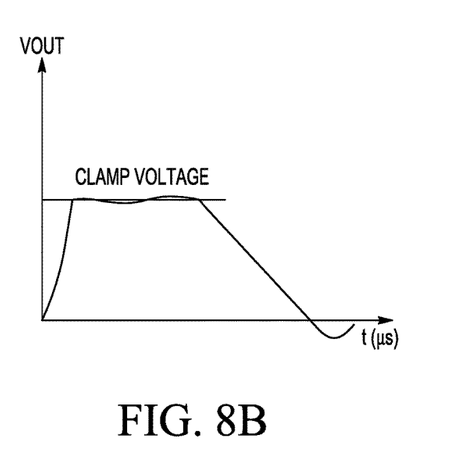
FIG. 8B is a graph of an output voltage of the surge protection circuit of the present invention.

FIG. 8A is a graph of a surge input voltage Vin of the surge protection circuit of the present invention; and FIG. 8B is a graph of the output voltage Vout of the surge protection circuit of the present invention. From FIG. 8B, it can be seen that the surge input voltage Vin shown in FIG. 8A is clamped by the surge protection circuit of the present invention to a substantively constant and safe clamp voltage Vout. The output voltage level of the surge protection circuit is dependent on numbers of cascaded diodes or transistors in the DC voltage detection circuit 107.

In the above exemplary embodiments, the surge protection circuit utilizes the amplification circuit to generate an amplified trigger signal to make the N-type transistor MN51 turn on, and a voltage required to trigger the P-type transistor MP51 to turn on is smaller than the voltage required to trigger the N-type transistor MN31 of the prior art surge protection circuit shown in FIG. 3, thus the surge protection circuit of the present invention can trigger the current conducting unit (the N-type transistor MN51) to conduct surge currents to ground when the surge input voltage is smaller as compared with the prior art surge protection circuit shown in FIG. 3.

The output voltage of the surge protection circuit of the present invention is influenced by Vsg of the P-type transistor MP51. Since the P-type transistor MP51 can be triggered to turn on with small Vsg of the P-type transistor MP51, a variation of Vsg caused by different levels of surge pulses is also very small, causing a variation of the output voltage of the surge protection circuit of the present invention is very small.

Further, since the output voltage of the surge protection circuit of the present invention is influenced by a small Vsg of the P-type transistor MP51, less voltage headroom above the maximum operating voltage and below the failure voltage of the N-type transistor MN51 is needed.

The surge protection circuit of the present invention can handle surges from several tens of volt voltages to more than one hundred volt voltages in the mobile application. For high voltage application, an extended drain NMOST device can be used as the current conducting unit. In addition, the surge protection circuit of the present invention can easily be integrated with Power Management Integrated Circuits (PMICs), connector ICs, load switches and other interface chips. Further, since the surge protection circuit of the present invention also include the AC trigger circuit, it also has the immunity capability of ESD.

In the foregoing specification, the invention has been described with reference to specific examples of embodiments of the invention. It will, however, be evident that various modifications and changes may be made therein without departing from the broader spirit and scope of the invention as set forth in the appended claims.

In the claims, the words 'comprising' and 'having' do not exclude the presence of other elements or steps then those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A surge protection circuit, comprising:
   a current conducting unit (MN51) connected between an input terminal and ground;
   an amplification circuit including (i) a first transistor (MP51) having a source terminal connected to the input terminal, (ii) a first resistor (R51) connected between a drain terminal of the first transistor and the ground, (iii) a second transistor (MN52) having a source terminal connected to the ground, and (iv) a second resistor (R52) connected between the input terminal and a drain terminal of the second transistor, wherein a gate of the first transistor is connected to the drain terminal of the second transistor and the current conducting unit is connected to the drain terminal of the first transistor;
   a voltage lifting circuit including (i) a third transistor (MP52) having a source terminal connected to the input terminal, (ii) a third resistor (R53) connected between the input, terminal and a gate terminal of the third transistor, and (iii) fourth and fifth resistors (R54 and R55) connected in series between a drain terminal of the third transistor and the ground, wherein a gate terminal of the second transistor is connected to a node between the fourth and fifth resistors; and
   a DC voltage detection circuit connected between the gate terminal of the first transistor and the ground.

2. The surge protection circuit of claim 1, wherein the DC voltage detection circuit includes one or more elements selected from a diode group and a transistor group.

3. The surge protection circuit of claim 2, wherein the diode group includes forward diodes, junction diodes, and Zener diodes.

4. The surge protection circuit of claim 2, wherein the transistor group includes NMOS transistors, PMOS transistors, bipolar transistors, and extended drain transistors.

5. The surge protection circuit of claim 1, wherein the DC voltage detection circuit comprises:
   a plurality of cascaded diodes, wherein a first diode of the plurality of cascaded diodes has an input terminal connected to the ground and a last diode of the plurality of cascaded diodes has an output terminal connected to the gate of the first transistor, and
   wherein the cascaded diodes detect a DC voltage for a surge event and enter a reverse turn-on state when the DC voltage exceeds a predetermined voltage, and wherein after the cascaded diodes turn on, they generate a Vgs continuously for the first transistor (MP51) to turn on the first transistor.

6. The surge protection circuit of claim 1, wherein the DC voltage detection circuit comprises:
   a plurality of cascaded PMOS transistors that detect a DC voltage for a surge event and turn on when the DC voltage exceeds a predetermined voltage, and wherein after the cascaded PMOS transistors turn on, they generate a Vgs continuously for the first transistor (MP51) to turn on the first transistor.

\* \* \* \* \*